(12) United States Patent
Tseng

(10) Patent No.: US 10,320,048 B2
(45) Date of Patent: Jun. 11, 2019

(54) CIRCUIT BOARD AND COMMUNICATION DEVICE WITH SIDE COUPLER

(71) Applicant: MICROELECTRONICS TECHNOLOGY, INC., Hsinchu (TW)

(72) Inventor: Ping-Chin Tseng, Hsinchu (TW)

(73) Assignee: MICROELECTRONICS TECHNOLOGY, INC., Hsinchu (TW)

( * ) Notice: Subject to any disclaimer, the term of this patent is extended or adjusted under 35 U.S.C. 154(b) by 0 days.

(21) Appl. No.: 15/978,574

(22) Filed: May 14, 2018

(65) Prior Publication Data

US 2019/0058234 A1 Feb. 21, 2019

Related U.S. Application Data

(60) Provisional application No. 62/546,827, filed on Aug. 17, 2017.

(51) Int. Cl.
| | |
|---|---|
| *H05K 7/02* | (2006.01) |
| *H01P 5/18* | (2006.01) |
| *H01P 3/08* | (2006.01) |
| *H05K 1/02* | (2006.01) |
| *H05K 5/00* | (2006.01) |
| *H05K 1/18* | (2006.01) |
| *H05K 7/04* | (2006.01) |

(52) U.S. Cl.
CPC .............. *H01P 5/184* (2013.01); *H01P 3/081* (2013.01); *H05K 1/0243* (2013.01); *H05K 1/181* (2013.01); *H05K 5/0047* (2013.01); *H05K 2201/09036* (2013.01); *H05K 2201/10151* (2013.01); *H05K 2201/10522* (2013.01); *H05K 2201/2018* (2013.01)

(58) Field of Classification Search
CPC .................................. H01P 5/087; H01P 5/107
See application file for complete search history.

(56) References Cited

U.S. PATENT DOCUMENTS

| 6,356,168 B1 * | 3/2002 | Barnett | H01P 1/20381 |
| | | | 333/202 |
| 8,680,936 B2 * | 3/2014 | Purden | H01P 5/107 |
| | | | 333/208 |
| 9,270,005 B2 * | 2/2016 | Leiba | H01P 3/003 |
| 2004/0066251 A1 * | 4/2004 | Eleftheriades | B82Y 20/00 |
| | | | 333/117 |
| 2004/0145427 A1 * | 7/2004 | Snyder | H01P 5/187 |
| | | | 333/116 |

(Continued)

*Primary Examiner* — Yuriy Semenenko
(74) *Attorney, Agent, or Firm* — Muncy, Geissler, Olds & Lowe, P.C.

(57) ABSTRACT

A communication device includes a circuit board having an upper surface and a lower surface, an upper housing disposed on the upper surface, and a lower housing disposed on the lower surface. The circuit board includes a top metal frame disposed on the upper surface, wherein the top metal frame defines a top cavity; a bottom metal frame disposed on the bottom surface, wherein the bottom metal frame defines a bottom cavity corresponding to the top cavity; a microstrip line disposed on the upper surface and extending into the top cavity; and a side coupler disposed on the lower surface and extending into the bottom cavity. The upper housing includes a depression corresponding to the top cavity, and the lower housing includes an aperture corresponding to the bottom cavity.

20 Claims, 11 Drawing Sheets

(56) References Cited

U.S. PATENT DOCUMENTS

| | | | |
|---|---|---|---|
| 2005/0116788 A1* | 6/2005 | Matters-Kammerer | ................... H03H 7/48 333/116 |
| 2007/0229368 A1* | 10/2007 | Hata | ............... H01P 5/10 343/700 MS |
| 2008/0024241 A1* | 1/2008 | Hata | ............... H01P 5/10 333/26 |
| 2012/0188030 A1* | 7/2012 | Liu | ............... H01P 5/107 333/238 |
| 2012/0256707 A1* | 10/2012 | Leiba | ................ H01P 3/003 333/208 |
| 2015/0054593 A1* | 2/2015 | Wang | ................ H01P 5/087 333/26 |

* cited by examiner

CIRCUIT BOARD AND COMMUNICATION DEVICE WITH SIDE COUPLER

PRIORITY CLAIM AND CROSS-REFERENCE

This application claims priority of U.S. provisional application Ser. No. 62/546,827 filed on Aug. 17, 2017, which is incorporated herein by reference in its entirety.

TECHNICAL FIELD

The present disclosure relates to a circuit board and a communication device, and more particularly, to a circuit board and a communication device with a side coupler for detecting output power.

DISCUSSION OF THE BACKGROUND

In conventional communication devices, an extra power directional coupler or power-sensing integrated circuit (IC) is typically required in the amplifiers on the circuit board to monitor the power output of satellites or wireless signal point-to-point converters. However, installing power directional couplers or power-sensing ICs creates some drawbacks, such as the need for a larger board area when such devices are installed. Furthermore, the detection circuit generates additional insertion loss. In addition, it increases the overall cost of the circuit board.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a circuit board, comprising a substrate having an upper surface and a lower surface; a top metal frame disposed on the upper surface, wherein the top metal frame defines a top cavity; a bottom metal frame disposed on the bottom surface, wherein the bottom metal frame defines a bottom cavity corresponding to the top cavity; a microstrip line disposed on the upper surface and extending into the top cavity; and a side coupler disposed on the lower surface and extending into the bottom cavity.

In some embodiments, the side coupler comprises a linear conductor having a first end extending into the bottom cavity and a second end connected to a through conductor, and the through conductor penetrates the substrate.

In some embodiments, the circuit board further comprises a power conversion circuit disposed on the upper surface and electrically connected to the through conductor of the side coupler.

In some embodiments, the circuit board further comprises a plurality of conductors electrically connecting the top metal frame to the bottom metal frame.

In some embodiments, the top metal frame comprises a top passage gap, and the microstrip line extends into the top cavity through the top passage gap.

In some embodiments, the bottom metal frame comprises a bottom passage gap, and the side coupler extends into the top cavity through the bottom passage gap.

In some embodiments, the bottom metal frame and the side coupler are disposed on the same plane.

In some embodiments, the side coupler is electrically isolated from the bottom metal frame.

Another aspect of the present disclosure provides a communication device, comprising a circuit board, an upper housing disposed on an upper side of the circuit board, and a lower housing disposed on a lower side of the circuit board. The circuit board comprises a substrate having an upper surface and a lower surface; a top metal frame disposed on the upper surface, wherein the top metal frame defines a top cavity; a bottom metal frame disposed on the bottom surface, wherein the bottom metal frame defines a bottom cavity corresponding to the top cavity; a microstrip line disposed on the upper surface and extending into the top cavity; and a side coupler disposed on the lower surface and extending into the bottom cavity.

In some embodiments, the upper space has a height of one quarter of the operating wavelength of the communication device.

In some embodiments, the communication device further comprises an amplifier disposed on the upper surface and electrically connected to the microstrip line.

In some embodiments, the side coupler comprises a linear conductor having a first end extending into the bottom cavity and a second end connected to a through conductor, and the through conductor penetrates the substrate.

In some embodiments, the communication device further comprises a power conversion circuit disposed on the upper surface and electrically connected to the through conductor of the side coupler.

In some embodiments, the circuit board further comprises a plurality of conductors electrically connecting the top metal frame to the bottom metal frame.

In some embodiments, the top metal frame comprises a top passage gap, and the microstrip line extends into the top cavity through the top passage gap.

In some embodiments, the bottom metal frame comprises a bottom passage gap, and the side coupler extends into the top cavity through the bottom passage gap.

In some embodiments, the bottom metal frame and the side coupler are disposed on the same plane.

In some embodiments, the side coupler is electrically isolated from the bottom metal frame.

In some embodiments, the depression forms a reflection waveguide.

In some embodiments, the aperture forms an output waveguide.

In the present disclosure, the coupling loss of the side coupler can be changed by adjusting the length (L) of the side coupler, so as to control the coupling loss to fit the desired linear power detection range.

In the present disclosure, the side coupler is used to replace the conventional power directional coupler, and the microstrip line and the side coupler are coupled to generate the required power for further conversion of the power to the voltage. In this way, the size of the circuit board can be effectively reduced and the manufacturing cost of the expensive circuit board can be reduced correspondingly.

The foregoing has outlined rather broadly the features and technical advantages of the present disclosure in order that the detailed description of the disclosure that follows may be better understood. Additional features and technical advantages of the disclosure are described hereinafter and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be connected to the figures' reference numbers, which refer to similar elements throughout the description, and:

DETAILED DESCRIPTION

Figure 1:
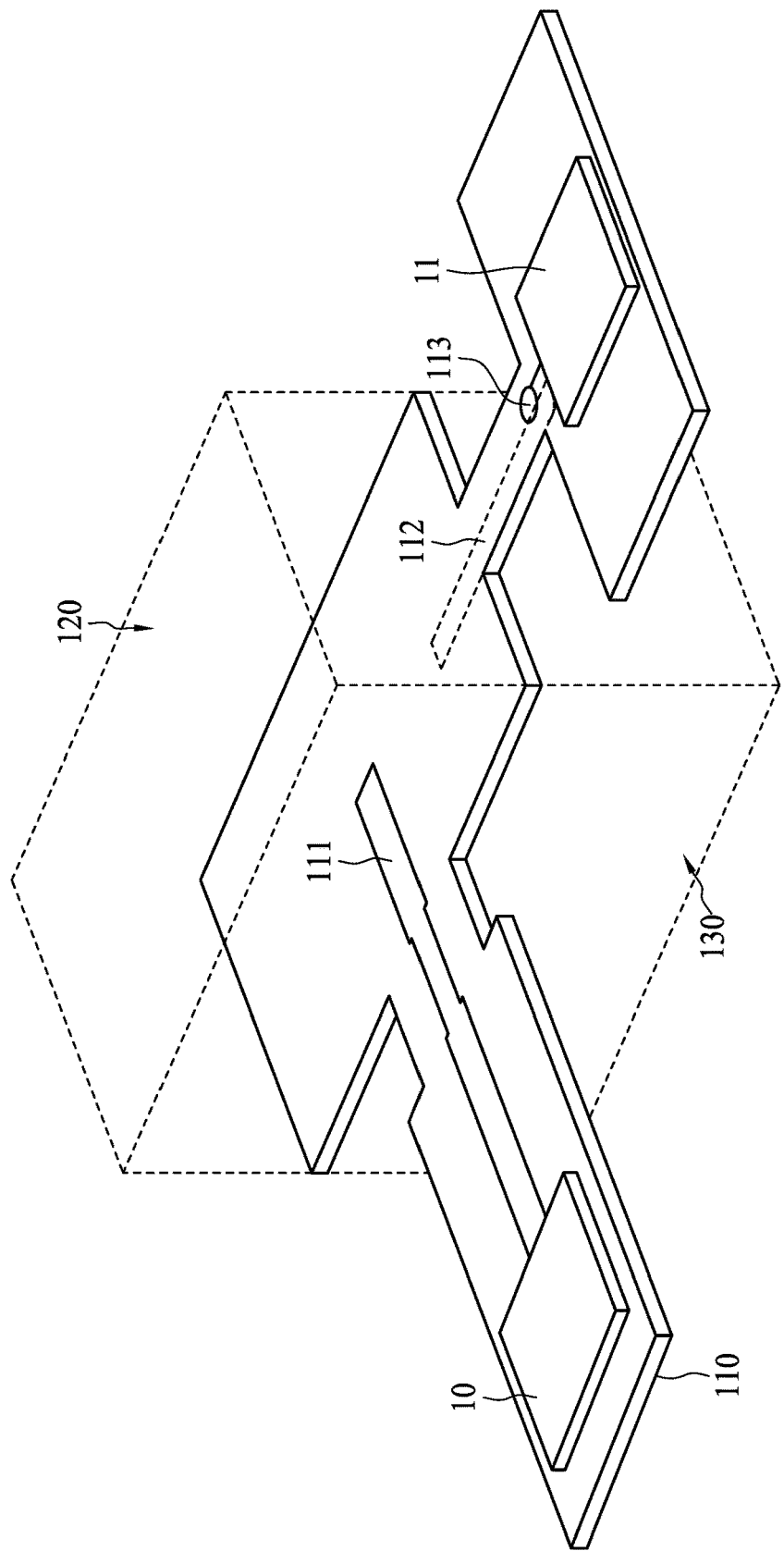
FIG. 1 is schematic diagram of a communication device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is schematic diagram of a communication device 100 in accordance with some embodiments of the present disclosure. Referring to FIG. 1, in some embodiments, the communication device 100, such as a microwave communication device, includes a substrate 110, such as an FR-4 substrate. In some embodiments, the upper side and the lower side of the substrate 110 have an upper space 120 and a lower space 130, respectively.

Figure 2A:
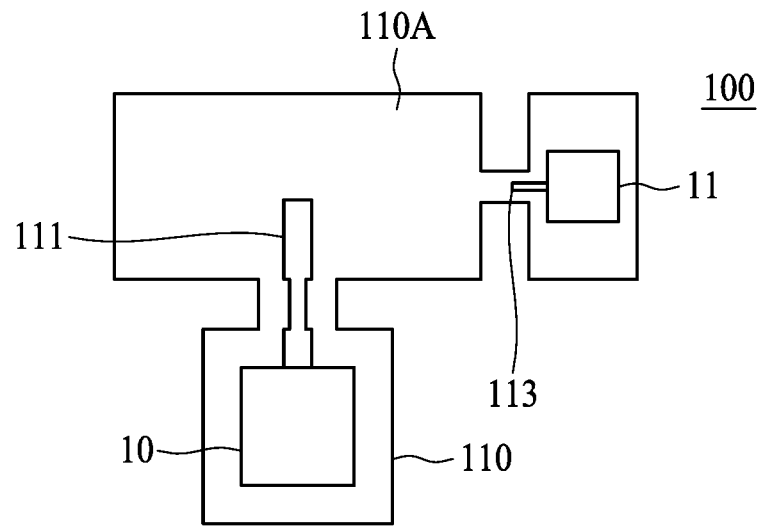
FIG. 2A and FIG. 2B are schematic diagrams of the substrate in FIG. 1 in accordance with some embodiments of the present disclosure.
Figure 2B:
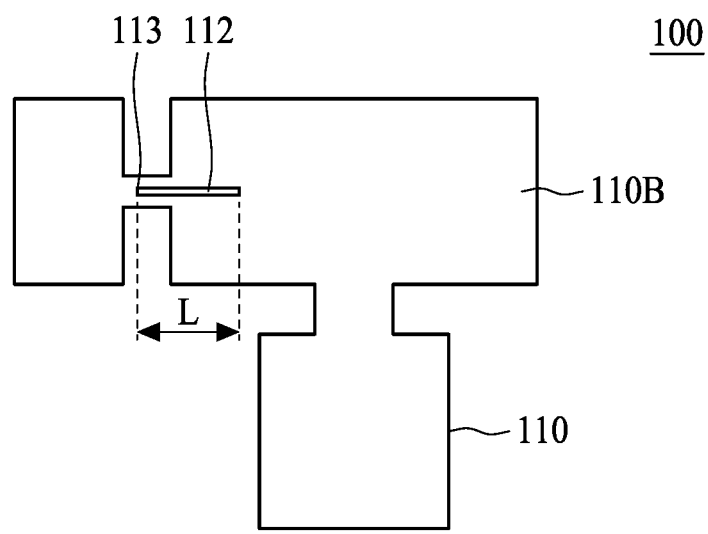

FIG. 2A and FIG. 2B are schematic diagrams of the communication device 100 in FIG. 1 in accordance with some embodiments of the present disclosure. In some embodiments, the substrate 110 of the communication device 100 includes an upper surface 110A and a lower surface 110B, and the upper space 120 and the lower space 130 are disposed respectively over the upper surface 110A and below the lower surface 110B. In some embodiments, the upper space 120 may be implemented by disposing a hollow shell over the upper surface 110A of the substrate 110. In some embodiments, the lower space 130 implements an output waveguide, which is a passage space for the microwave signals. In some embodiments, the upper space 120 implements a reflection waveguide, and the height of the upper space 120 is one-quarter of the designed operating wavelength of the communication device 100, wherein the height is designed so that the microwave signals are reflected back to the lower space 130.

Referring to FIG. 1, FIG. 2A and FIG. 2B, in some embodiments, the communication device 100 further includes a microstrip line 11 and a side coupler 112 disposed on different planes of the communication device 100. In some embodiments, the microstrip line 111 and the side coupler 112 are disposed on different sides of the substrate 110; for example, the microstrip line 111 is disposed on the upper surface 110A, while the side coupler 112 is disposed on the lower surface 110B.

Referring to FIG. 1 and FIG. 2A, in some embodiments, the microstrip line 111 serves as an input terminal connected to an electronic device such a signal amplifier 10, and the signals from the signal amplifier 10 are converted by a microstrip-to-waveguide conversion mechanism implemented on the upper surface 110A and in the upper space 120. In some embodiments, in the lower space 130, the converted signal is then conducted to the side coupler 112 on the lower surface 110B.

Referring to FIG. 1 and FIG. 2B, in some embodiments, a major portion of the microwave power from the microstrip line 111 is outputted through the output waveguide (the lower space 130) to the outside of the communication device 100, while a minor portion of the microwave power from the microstrip line 111 can be coupled out of the output waveguide (the lower space 130) by the side coupler 112 in the lower space 130. In some embodiments, the coupling loss of the side coupler 112 can be adjusted by changing the length (L) of the side coupler 112, and the length (L) can be adjusted in view of the power requirement of the communication device 100. In some embodiments, the minor portion of the microwave power coupled out by the side coupler 112 is then passed to a power conversion circuit 11 on the upper surface 110A for further conversion to a voltage signal.

Referring to FIG. 1 and FIG. 2A, in some embodiments, the power conversion circuit 11 is disposed on the upper surface 110A of the substrate 110 and connected to the side coupler 112. In some embodiments, a through conductor 113 penetrates the substrate 110 from the lower surface 110B to the upper surface 110A, and the through conductor 112A electrically connects the side coupler 112 on the lower surface 110B to the power conversion circuit 11 on the upper surface 110A.

Some coupling losses are generated during the coupling process. In some embodiments, in order to make the power detection range of the communication equipment fall within a preferable linear region, i.e., a region where power and voltage conversion are relatively linear; the coupling loss can be changed by adjusting the coupling ratio of the side coupler 112, e.g., by changing the length (L) of the side coupler 112 to control the coupling loss to fit the desired linear power detection range.

Figure 3A:
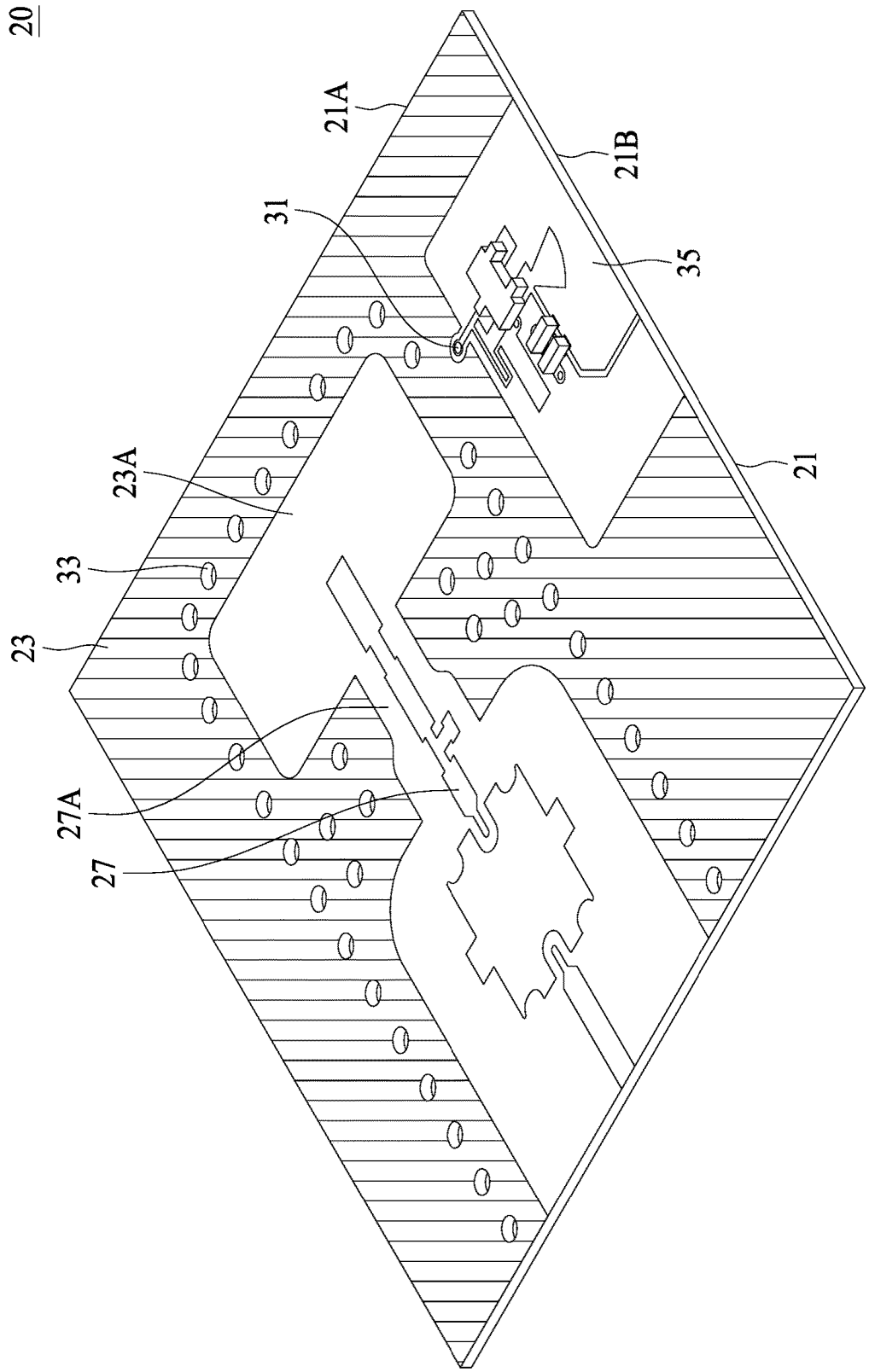
FIG. 3A and FIG. 3B are schematic diagrams of a circuit board at different viewing angles in accordance with some embodiments of the present disclosure.
Figure 3B:
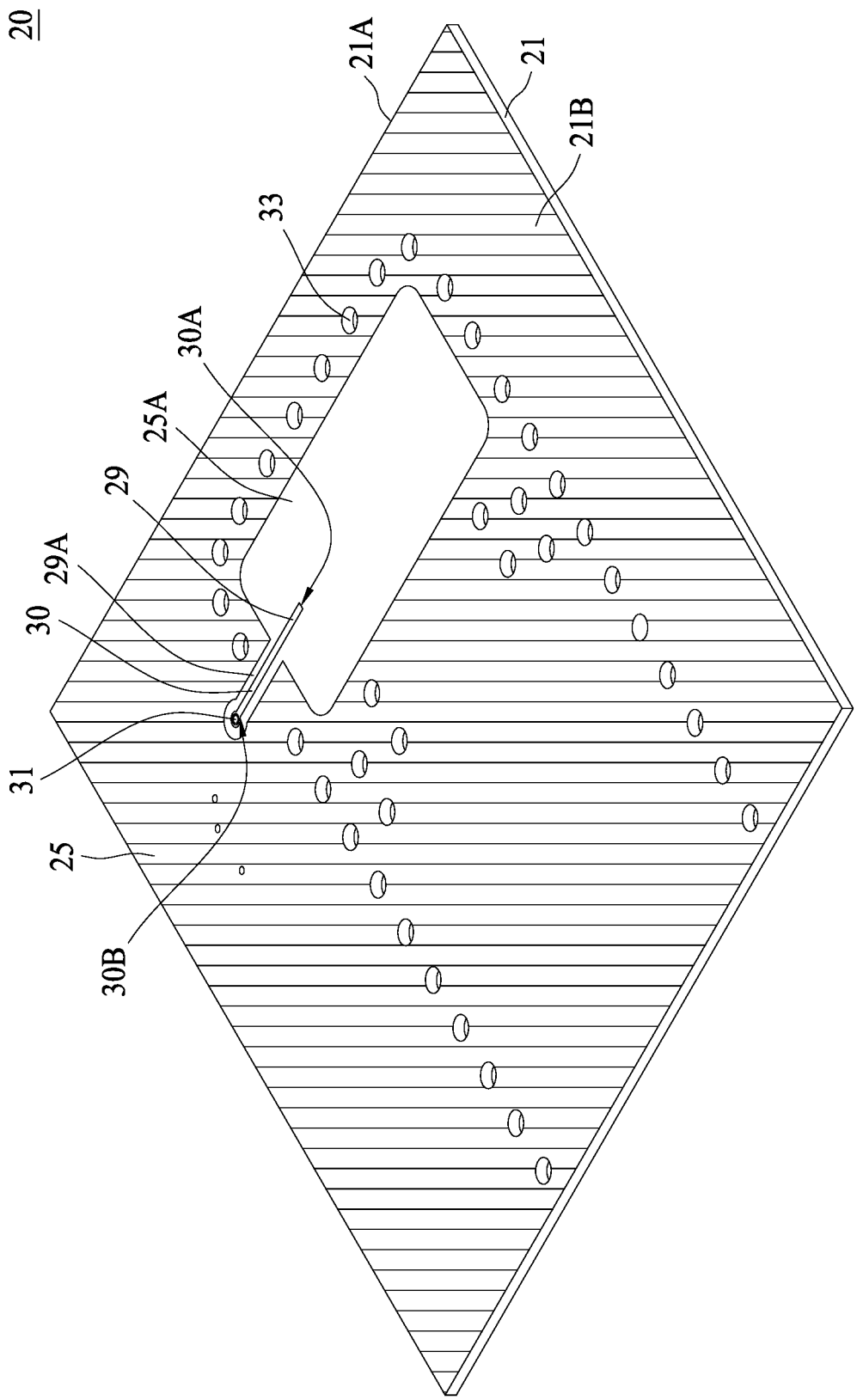

FIG. 3A and FIG. 3B are schematic diagrams of a circuit board 20 at different viewing angles in accordance with some embodiments of the present disclosure. In some embodiments, the circuit board 20 comprises a substrate 21, such as an FR-4 substrate, having an upper surface 21A and a lower surface 21B; a top metal frame 23 disposed on the upper surface 21A, wherein the top metal frame 23 defines a top cavity 23A; a bottom metal frame 25 disposed on the bottom surface 21B, wherein the bottom metal frame 25 defines a bottom cavity 25A corresponding to the top cavity 23A; a microstrip line 27 disposed on the upper surface 21A and extending into the top cavity 23A; and a side coupler 29 disposed on the lower surface 21B and extending into the bottom cavity 25A. In some embodiments, the circuit board 20 further comprises a plurality of conductors 33 such as conductive through vias/holes electrically connecting the top metal frame 23 to the bottom metal frame 25.

Referring to FIG. 3B, in some embodiments, the side coupler 29 comprises a linear conductor 30 having a first end 30A in the bottom cavity 25A and a second end 30B connected to a through conductor 31, and the through conductor 31 penetrates the substrate 21. In some embodiments, the bottom metal frame 25 also defines a bottom passage gap 29A, and the side coupler 29 extends into the bottom cavity 25A through the bottom passage gap 29A, and the side coupler 29 is electrically isolated from the bottom metal frame 25. In some embodiments, the bottom metal frame 25 and the side coupler 29 are disposed on the same plane, and can be integrally formed by the same fabrication process.

Referring to FIG. 3A, in some embodiments, the circuit board 20 comprises a power conversion circuit 35 such as a power-to-voltage converter disposed on the upper surface 21A and electrically connected to the through conductor 31, which further connects to the side coupler 29 on the lower surface 21B. In some embodiments, the top metal frame 23 also defines a top passage gap 27A, the microstrip line 27 extends into the top cavity 23A through the top passage gap 27A, and the microstrip line 27 is electrically isolated from the top metal frame 23.

Figure 4A:
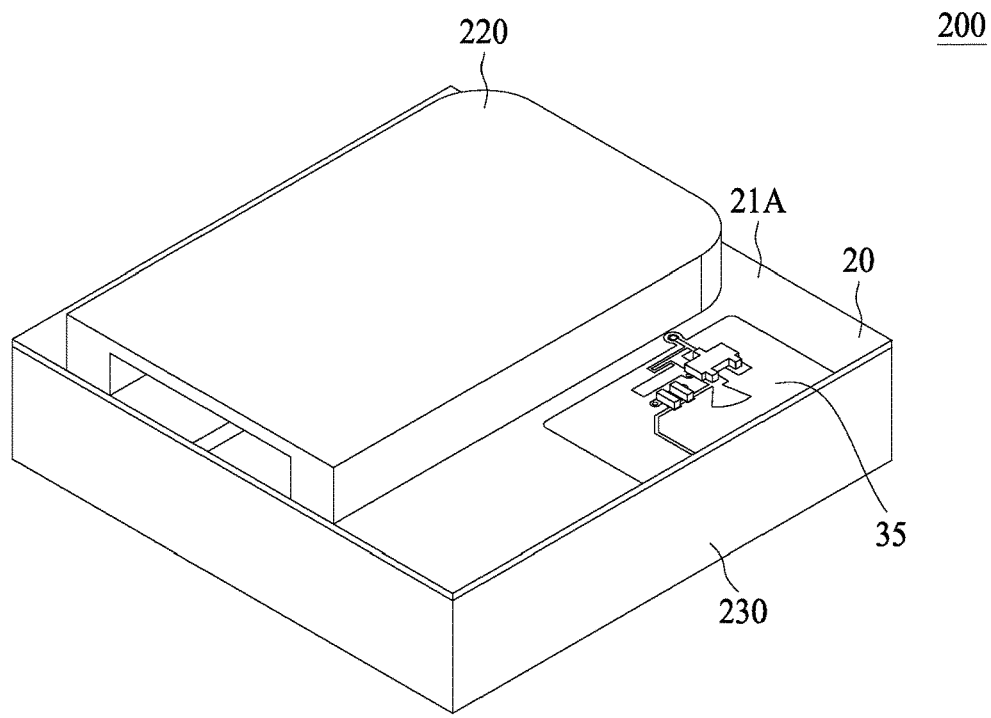
FIG. 4A and FIG. 4B are schematic assembled diagrams of a communication device at different viewing angles in accordance with some embodiments of the present disclosure.
Figure 4B:
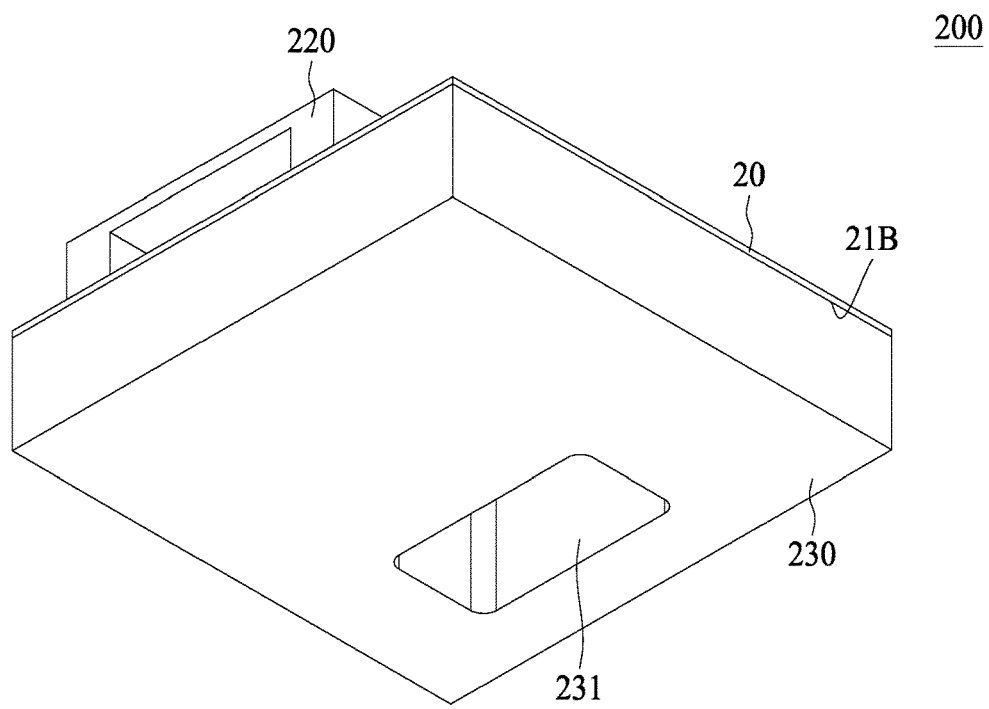
Figure 4C:
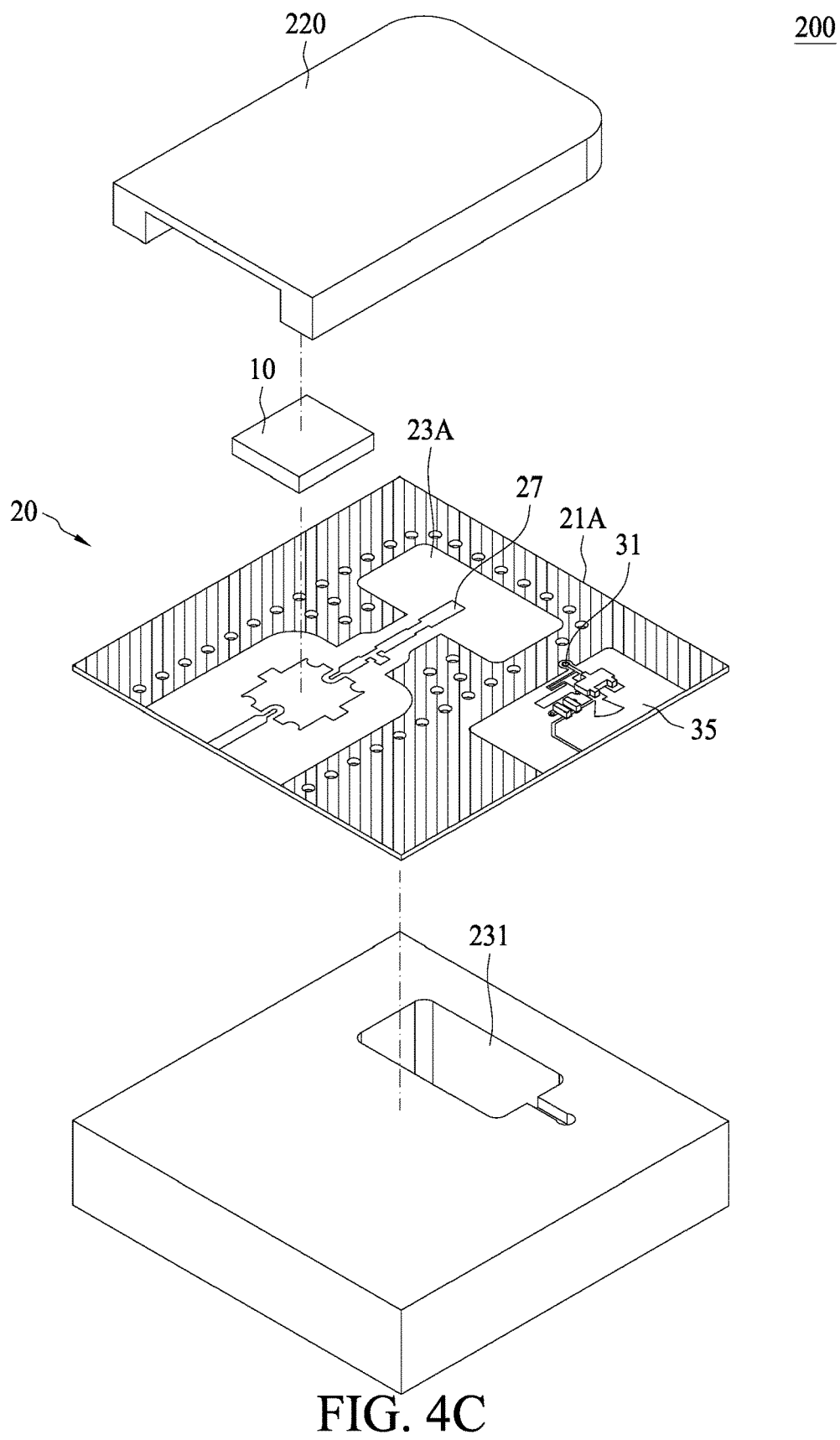
FIG. 4C and FIG. 4D are schematic disassembled diagrams of the communication device shown in FIG. 4A and FIG. 4B at different viewing angles in accordance with some embodiments of the present disclosure.
Figure 4D:
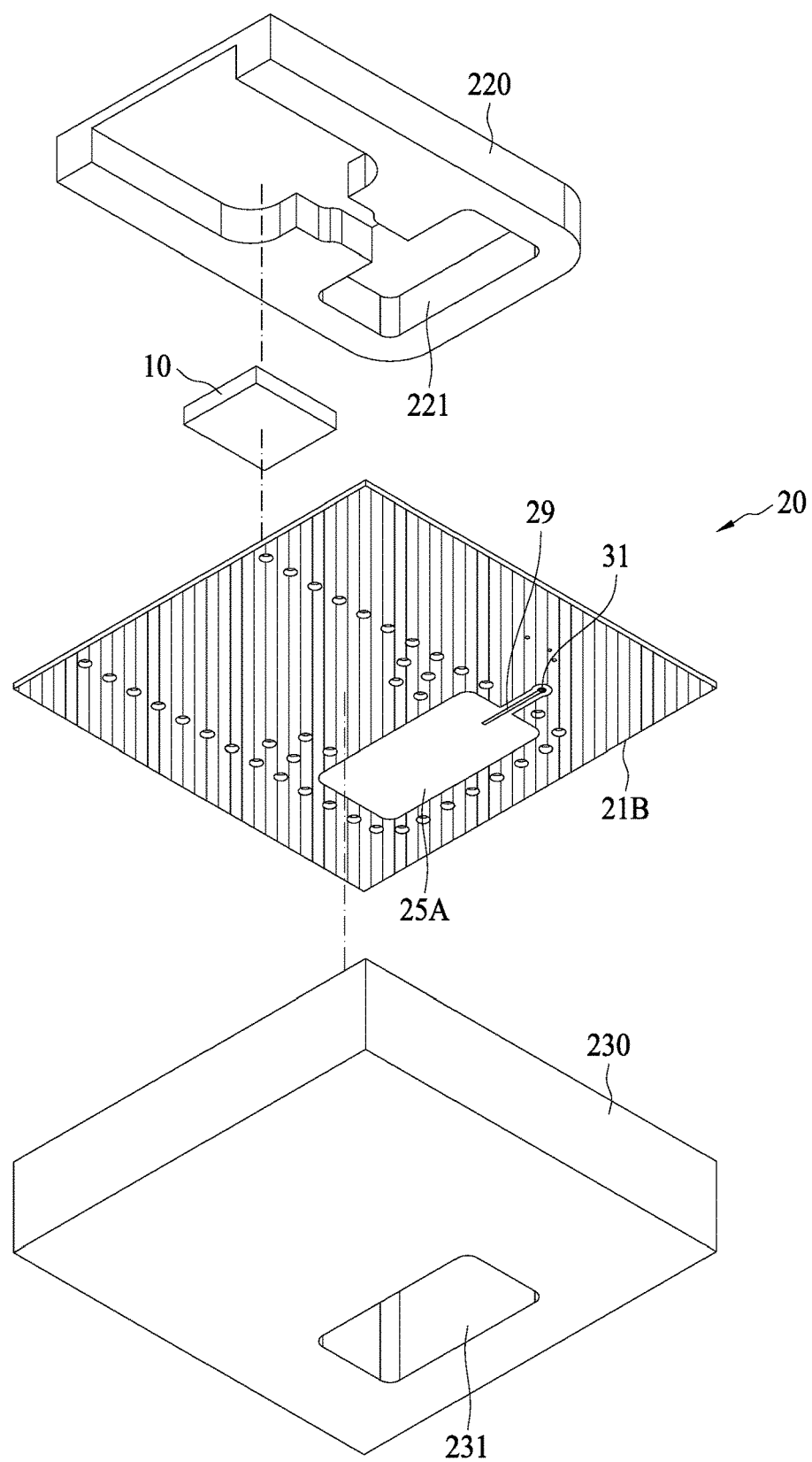

FIG. 4A and FIG. 4B are schematic assembled diagrams of a communication device 200 at different viewing angles in accordance with some embodiments of the present disclosure, and FIG. 4C and FIG. 4D are schematic disassembled diagrams of the communication device 200 at different viewing angles in accordance with some embodiments of the present disclosure. In some embodiments, the communication device 200 comprises the circuit board 20 in FIG. 3A, an upper housing 220 disposed on the upper surface 21A of the circuit board 20, and a lower housing 230 disposed on the lower surface 21B of the circuit board 20.

Referring to FIG. 4A and FIG. 4C, in some embodiments, the power conversion circuit 35 is disposed on the upper surface 21A of the circuit board 20 and is connected to the side coupler 29 on the lower surface 21B via the through conductor 31 penetrating the circuit board 20. In some embodiments, the power conversion circuit 35 is not covered by the upper housing 220. In some embodiments, the upper housing 220 comprises a depression 221 corresponding to the top cavity 23A, and the depression 221 implements the upper space 120 in FIG. 1, serving as the reflection waveguide.

Referring to FIG. 4B and FIG. 4D, in some embodiments, the lower housing 230 comprises an aperture 231 corresponding to the bottom cavity 25A. In some embodiments, the aperture 231 of the lower housing 230 implements the lower space 130 in FIG. 1, serving as an output waveguide, which is a passage space for the microwave signals.

Figure 5:
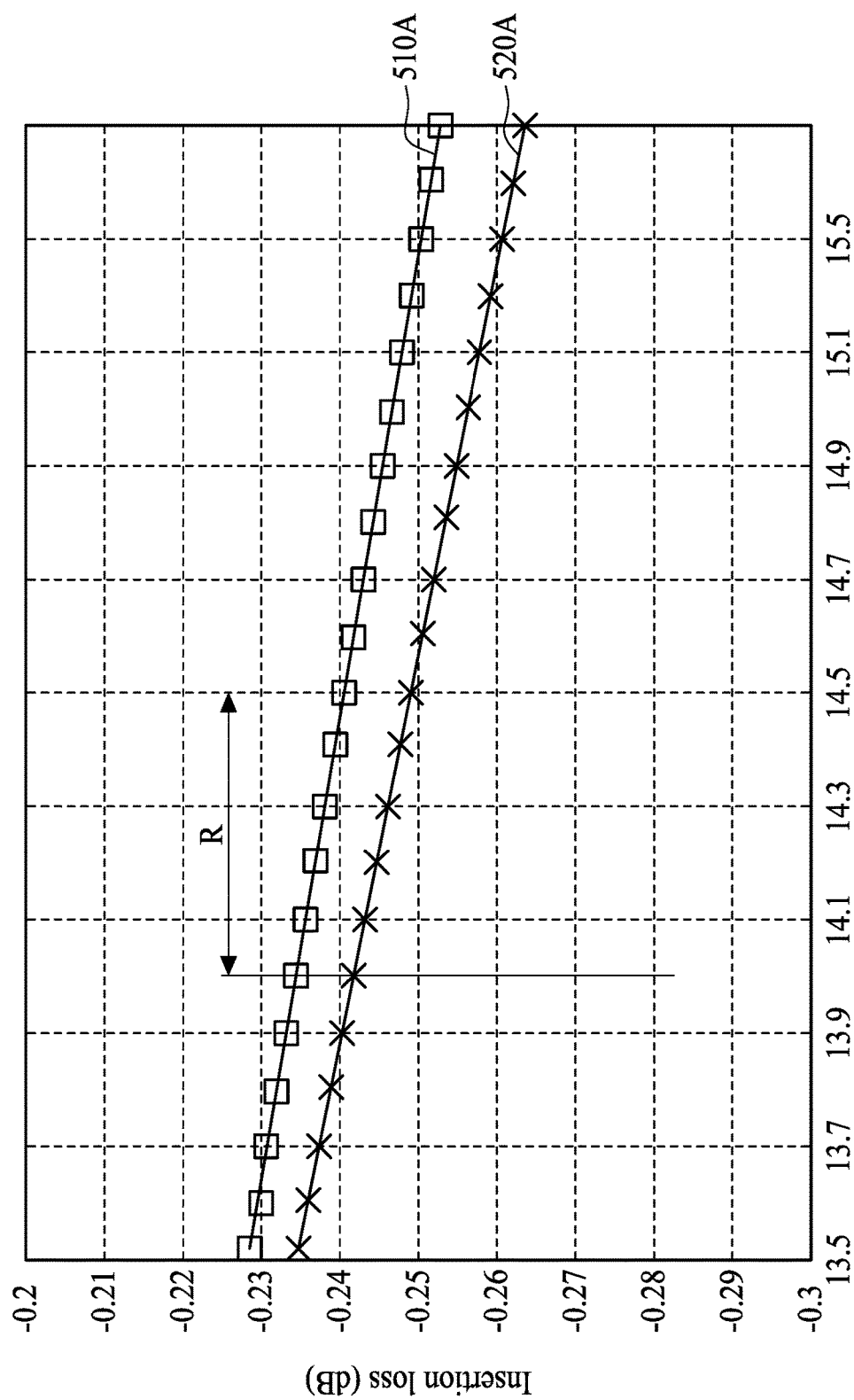
FIG. 5 is a graph showing the insertion loss of the communication device shown in FIG. 4A and a comparative communication device at different frequencies in accordance with some embodiments of the present disclosure.
Figure 6:
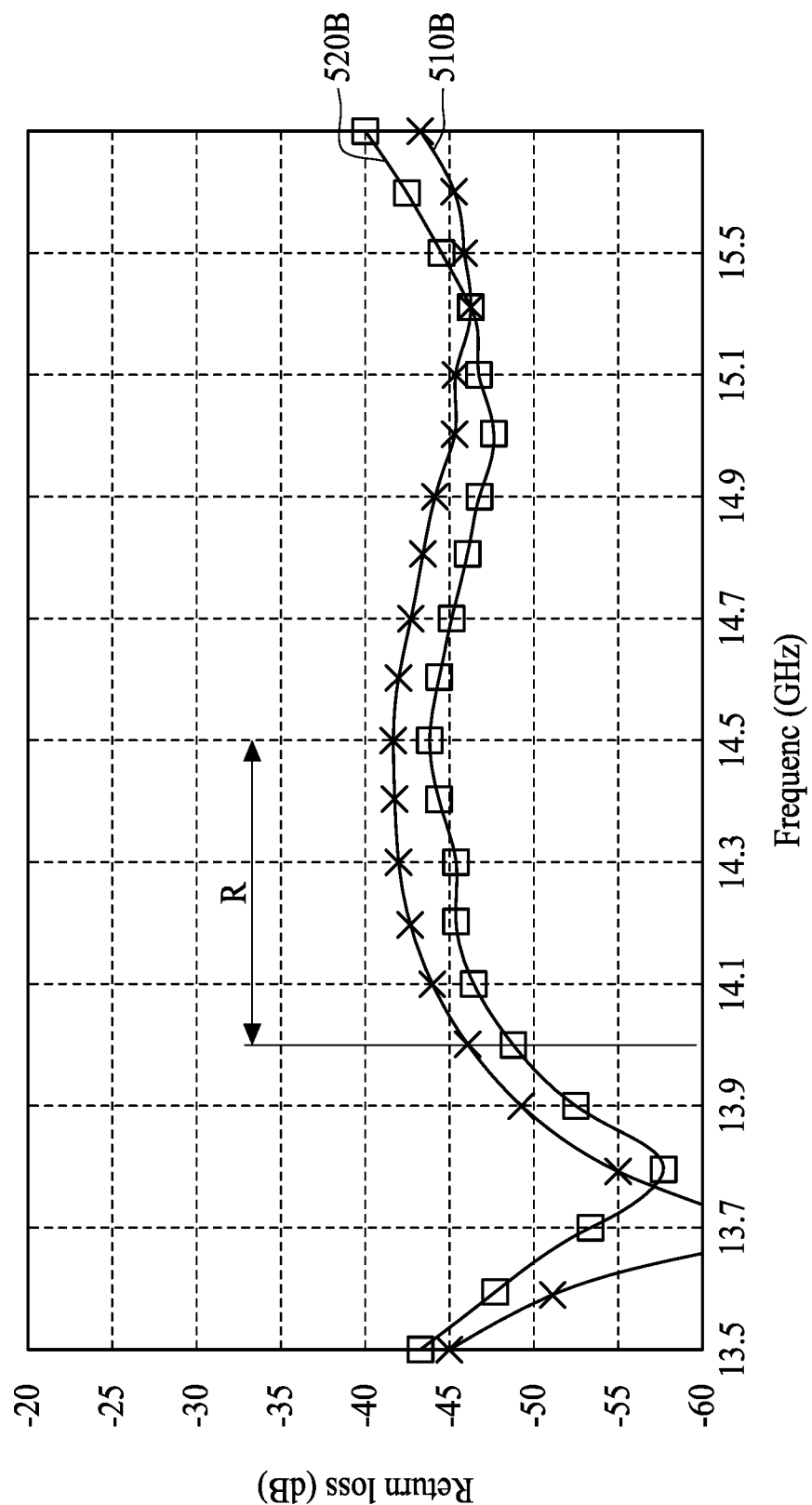
FIG. 6 is a graph showing the return loss of the communication device shown in FIG. 4A and a comparative communication device at different frequencies in accordance with some embodiments of the present disclosure.

FIG. 5 is a graph showing the insertion loss of the communication device 200 and a comparative communication device at different frequencies in accordance with some embodiments of the present disclosure, and FIG. 6 is a graph showing the return loss of the communication device 200 and the comparative communication device at different frequencies in accordance with some embodiments of the present disclosure.

Referring to FIG. 5, the curve 510A represents the insertion losses of the comparative communication device without the side coupler 29, and the curve 520A represents the insertion losses of the communication device 200 with the side coupler 29. The range R indicates the designed operating frequency range of 14.0-14.5 GHz. As can be seen from FIG. 5, the difference in terms of the insertion loss between the curve 510A (without the side coupler) and the curve 520A (with the side coupler) is only about 0.01 dB. In other words, incorporating the side coupler 29 in the communication device 200 incurs a negligible insertion loss. In contrast, conventionally incorporating the power directional couplers or the power detection ICs can generate an insertion loss of 0.4 to 0.6 dB.

Referring to FIG. 6, the curve 510B represents the return losses of the comparative communication device without the side coupler 29, and the curve 520B represents the return losses of the communication device 200 with the side coupler 29. It can be seen from FIG. 6 that there is no significant difference between the curve 510B and the curve 520B. In other words, incorporating the side coupler 29 into the communication device 200 does not cause significant return loss.

Figure 7:
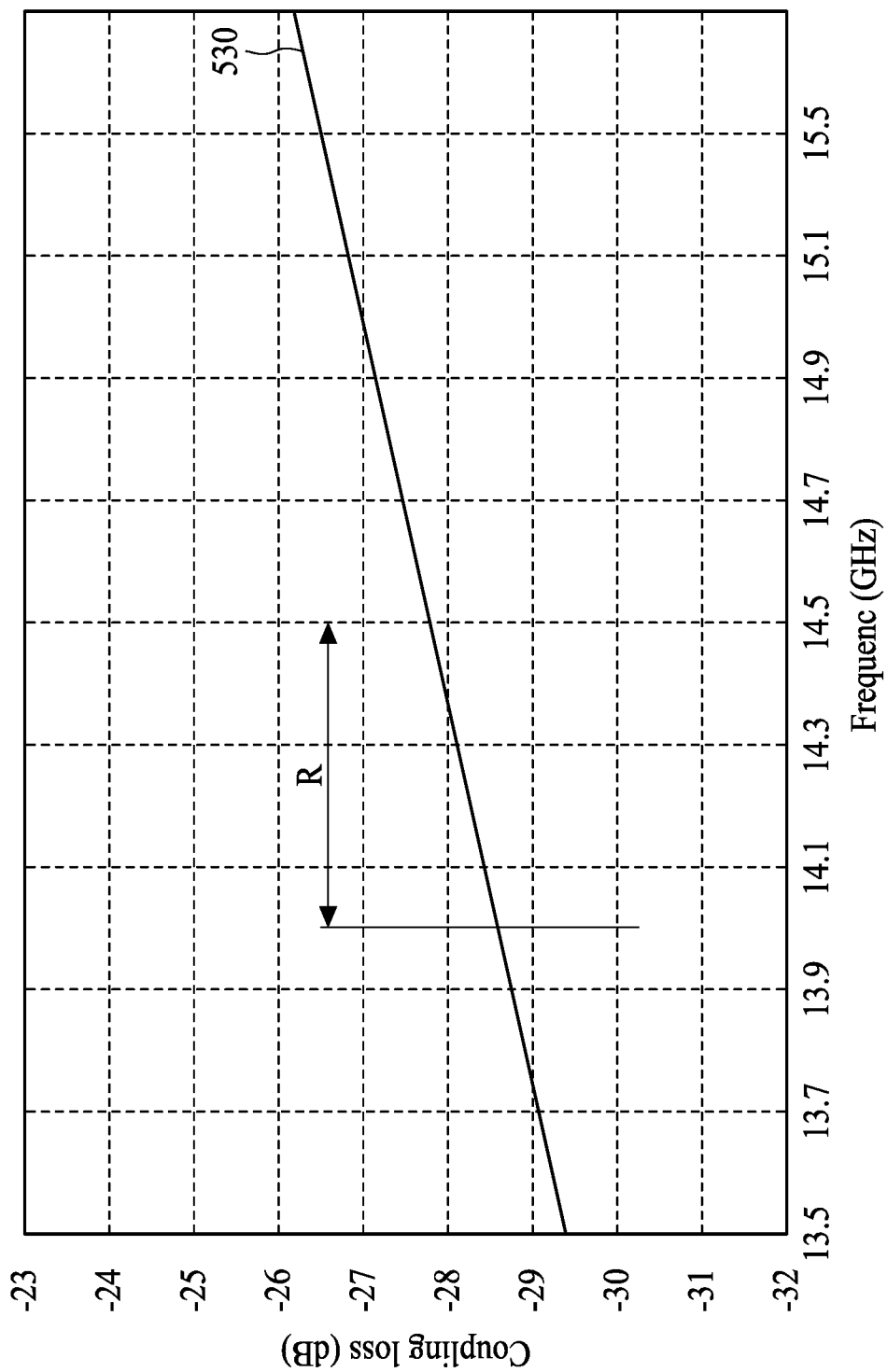
FIG. 7 is a graph showing the coupling loss of the communication device shown in FIG. 4A at different frequencies in accordance with some embodiments of the present disclosure.
Figure 8:
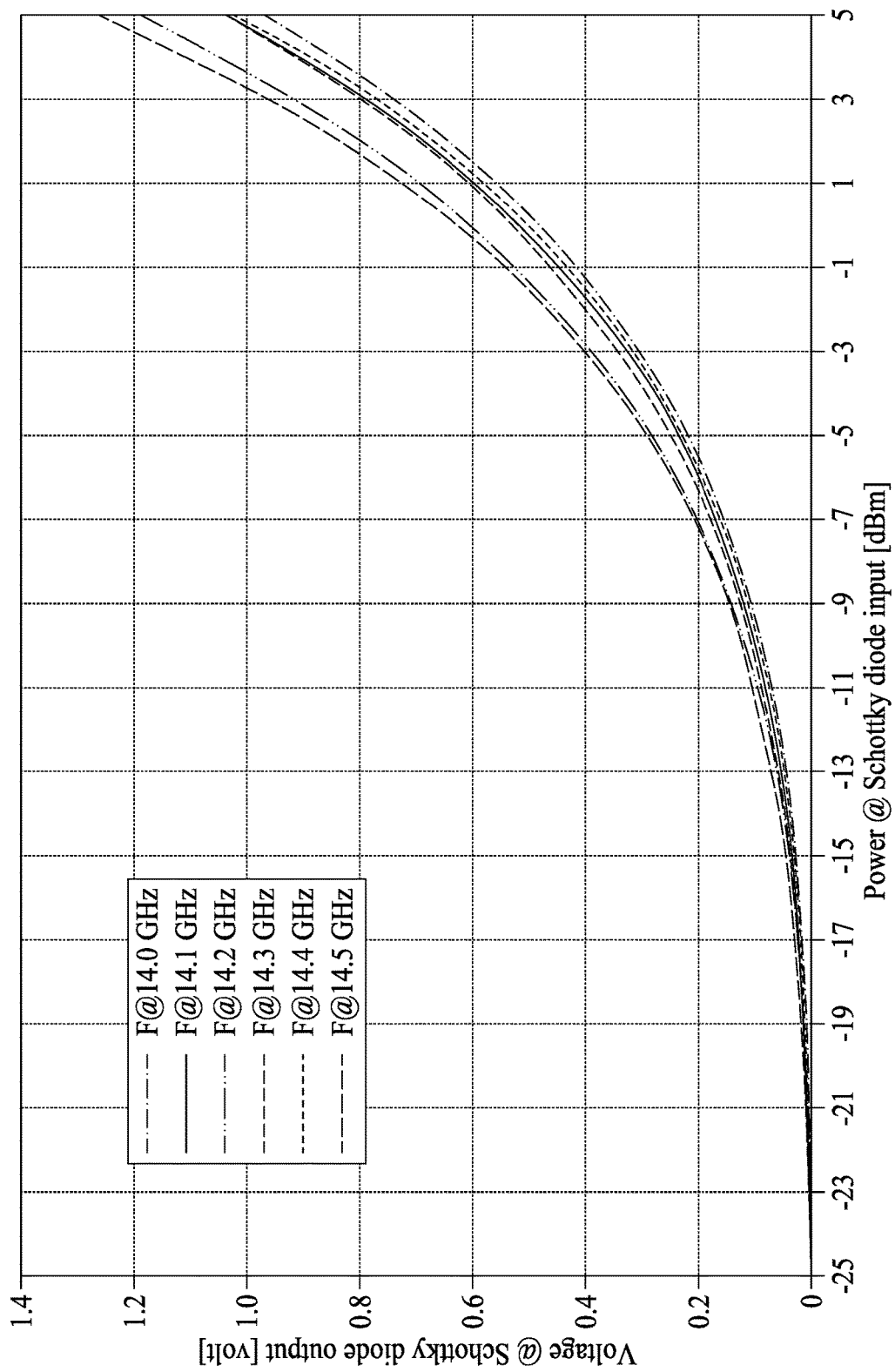
FIG. 8 is a graph showing transfer waveforms of a power conversion circuit at different frequencies in accordance with some embodiments of the present disclosure.

FIG. 7 is a graph showing the coupling loss of the communication device 200 in FIG. 4A at different frequencies in accordance with some embodiments of the present disclosure, and FIG. 8 is a graph showing the transfer waveforms of the power conversion circuit 35 such as a Schottky diode at different frequencies in accordance with some embodiments of the present disclosure. In the present disclosure, the coupling loss of the side coupler 29 can be changed by adjusting the length (L) of the side coupler 29, so as to control the coupling loss to fit the desired linear power detection range of the power conversion circuit 35.

Referring to FIG. 7, in an embodiment, when the power requirement of the communication device 200 is set to be 30 dBm, the coupling loss is about −28 dB in the designed operating frequency range of 14.0-14.5 GHz; referring to FIG. 8, the transfer waveforms of the power conversion circuit 35 have a linear region between −3.0 dBm and 5.0 dBm at input (horizontal axis). In other words, the difference between the power requirement (30 dBm) and the coupling loss (−28 dB) is about 2 dB, which falls within the linear region of the power conversion circuit 35. In case of different power requirements of the communication device 200, the length (L) of the side coupler 112 can be changed so that the difference between the power requirement and the coupling loss falls within the linear region of the power conversion circuit 35.

In the present disclosure, the side coupler 29 is used to replace the conventional power directional coupler, and the microstrip line 27 and the side coupler 29 are coupled to generate the required power for further conversion of the coupled power to the voltage. In this way, the size of the circuit board can be effectively reduced and the manufacturing cost of the expensive circuit board can be reduced correspondingly.

One aspect of the present disclosure provides a circuit board. The circuit board comprises a substrate having an upper surface and a lower surface; a top metal frame disposed on the upper surface, wherein the top metal frame defines a top cavity; a bottom metal frame disposed on the bottom surface, wherein the bottom metal frame defines a bottom cavity corresponding to the top cavity; a microstrip line disposed on the upper surface and extending into the top cavity; and a side coupler disposed on the lower surface and extending into the bottom cavity.

Another aspect of the present disclosure provides a communication device. The communication device comprises a circuit board, an upper housing disposed on an upper side of the circuit board, and a lower housing disposed on a lower side of the circuit board. The circuit board comprises a substrate having an upper surface and a lower surface; a top metal frame disposed on the upper surface, wherein the top metal frame defines a top cavity; a bottom metal frame disposed on the bottom surface, wherein the bottom metal frame defines a bottom cavity corresponding to the top cavity; a microstrip line disposed on the upper surface and extending into the top cavity; and a side coupler disposed on the lower surface and extending into the bottom cavity.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A circuit board, comprising:
a substrate having an upper surface and a lower surface;
a top metal frame disposed on the upper surface, wherein the top metal frame defines a top cavity;
a bottom metal frame disposed on the bottom surface, wherein the bottom metal frame defines a bottom cavity corresponding to the top cavity;
a microstrip line disposed on the upper surface and extending into the top cavity; and
a side coupler disposed on the lower surface and extending into the bottom cavity.

2. The circuit board of claim 1, wherein the side coupler comprises a linear conductor having a first end extending into the bottom cavity and a second end connected to a through conductor, and the through conductor penetrates the substrate.

3. The circuit board of claim 2, further comprising a power conversion circuit disposed on the upper surface and electrically connected to the through conductor of the side coupler.

4. The circuit board of claim 1, further comprising a plurality of conductors electrically connecting the top metal frame to the bottom metal frame.

5. The circuit board of claim 1, wherein the top metal frame comprises a top passage gap, and the microstrip line extends into the top cavity through the top passage gap.

6. The circuit board of claim 1, wherein the bottom metal frame comprises a bottom passage gap, and the side coupler extends into the top cavity through the bottom passage gap.

7. The circuit board of claim 1, wherein the bottom metal frame and the side coupler are disposed on the same plane.

8. The circuit board of claim 1, wherein the side coupler is electrically isolated from the bottom metal frame.

9. A communication device, comprising:
a circuit board, wherein the circuit board comprises a substrate having an upper surface and a lower surface; a top metal frame disposed on the upper surface, wherein the top metal frame defines a top cavity; a bottom metal frame disposed on the bottom surface, wherein the bottom metal frame defines a bottom cavity corresponding to the top cavity; a microstrip line disposed on the upper surface and extending into the top cavity; and a side coupler disposed on the lower surface and extending into the bottom cavity;
an upper housing disposed on the upper surface, wherein the upper housing comprises a depression corresponding to the top cavity; and
a lower housing disposed on the lower surface, wherein the lower housing comprises an aperture corresponding to the bottom cavity.

10. The communication device of claim 9, wherein the upper space has a height of one quarter of the operating wavelength of the communication device.

11. The communication device of claim 9, further comprising an amplifier disposed on the upper surface and electrically connected to the microstrip line.

12. The communication device of claim 9, wherein the side coupler comprises a linear conductor having a first end extending into the bottom cavity and a second end connected to a through conductor, and the through conductor penetrates the substrate.

13. The communication device of claim 12, further comprising a power conversion circuit disposed on the upper surface and electrically connected to the through conductor of the side coupler.

14. The communication device of claim 9, wherein the circuit board further comprises a plurality of conductors electrically connecting the top metal frame to the bottom metal frame.

15. The communication device of claim 9, wherein the top metal frame comprises a top passage gap, and the microstrip line extends into the top cavity through the top passage gap.

16. The communication device of claim 9, wherein the bottom metal frame comprises a bottom passage gap, and the side coupler extends into the top cavity through the bottom passage gap.

17. The communication device of claim 9, wherein the bottom metal frame and the side coupler are disposed on the same plane.

18. The communication device of claim 9, wherein the side coupler is electrically isolated from the bottom metal frame.

19. The communication device of claim 9, wherein the depression forms a reflection waveguide.

20. The communication device of claim 9, wherein the aperture forms an output waveguide.

* * * * *